United States Patent [19]

Cederbaum et al.

[11] Patent Number: 5,112,765
[45] Date of Patent: May 12, 1992

[54] METHOD OF FORMING STACKED TUNGSTEN GATE PFET DEVICES AND STRUCTURES RESULTING THEREFROM

[75] Inventors: Carl Cederbaum, Paris; Roland Chanclou, Perthess; Myriam Combes, Evry; Patrick Mone, Ponthierry; Vincent Vallet, Mennecy, all of France

[73] Assignee: International Business Machines Corporation, Armonk, N.Y.

[21] Appl. No.: 730,736

[22] Filed: Jul. 16, 1991

[30] Foreign Application Priority Data

Jul. 31, 1990 [EP] European Pat. Off. ........ 90480109.9

[51] Int. Cl.⁵ .................. H01L 21/283; H01L 21/90; H01L 21/335
[52] U.S. Cl. .............................. 437/41; 437/57; 437/192; 437/193; 437/228; 437/915; 148/DIG. 164
[58] Field of Search ................ 437/57, 193, 228, 915, 437/41, 48, 49, 192; 148/DIG. 164; 357/23.7

[56] References Cited

U.S. PATENT DOCUMENTS

| | | | |
|---|---|---|---|
| 4,430,365 | 2/1984 | Schaible et al. | 437/195 |
| 4,489,478 | 12/1984 | Sakurai | 357/23.7 |
| 4,596,604 | 6/1986 | Akiyama et al. | 148/1.5 |
| 4,767,724 | 8/1988 | Kim et al. | 437/194 |
| 4,795,722 | 1/1989 | Welch et al. | 437/192 |
| 4,800,176 | 1/1989 | Kakumu et al. | 437/193 |
| 4,840,923 | 6/1989 | Flagello et al. | 148/DIG. 164 |
| 4,902,637 | 2/1990 | Kondou et al. | 437/51 |
| 4,902,641 | 2/1990 | Koury, Jr. | 437/62 |
| 5,026,666 | 6/1991 | Hills et al. | 437/195 |
| 5,064,772 | 11/1991 | Jambotka | 437/31 |

FOREIGN PATENT DOCUMENTS

| | | |
|---|---|---|
| 0020135 | 12/1980 | European Pat. Off. ... 148/DIG. 164 |
| 0223920 | 6/1987 | European Pat. Off. . |
| 0281711 | 9/1988 | European Pat. Off. . |
| 0324198 | 7/1989 | European Pat. Off. . |
| 3628233 | 2/1987 | Fed. Rep. of Germany . |
| 2595165 | 9/1987 | France . |
| 63-40343 | 2/1988 | Japan .................. 437/915 |
| 63-213943 | 9/1988 | Japan .................. 437/915 |

OTHER PUBLICATIONS

European Search Report of EP 90480109.

Primary Examiner—T. N. Quach
Attorney, Agent, or Firm—Jeffrey L. Brandt; Harold Huberfeld

[57] ABSTRACT

A manufacturing method is provided for producing a stacked semiconductor structure including: depositing a first thick passivating layer onto the base structure; forming first stud openings in the first thick passivating layer exposing at least one active region and/or one of the polysilicon lines; depositing a first layer of a conductive material to fill the first stud openings and define first contact studs, the upper part of some of the first contact studs comprising the gate electrodes of PFET devices; planarizing the structure to make the top surface of the first contact studs coplanar with the surface of the first thick passivating layer; depositing a thick insulating layer to form the gate dielectric of PFET devices and patterning it to define contact openings to expose selected first contact studs at desired locations; depositing a layer of polysilicon; patterning the polysilicon layer to define polysilicon lands containing the first contact studs at the desired locations; selectively implanting to define the source and drain regions of the PFET devices and interconnection conductors; depositing a cap layer; depositing a second thick passivating layer forming second stud openings in the second thick passivating layer to expose desired portions of the polysilicon lands and/or portions of the first contact studs; depositing a second layer of conductive material to define second contact studs; and planarizing the structure to make the top surface of the second contact studs coplanar with the surface of the second thick passivating layer.

14 Claims, 8 Drawing Sheets

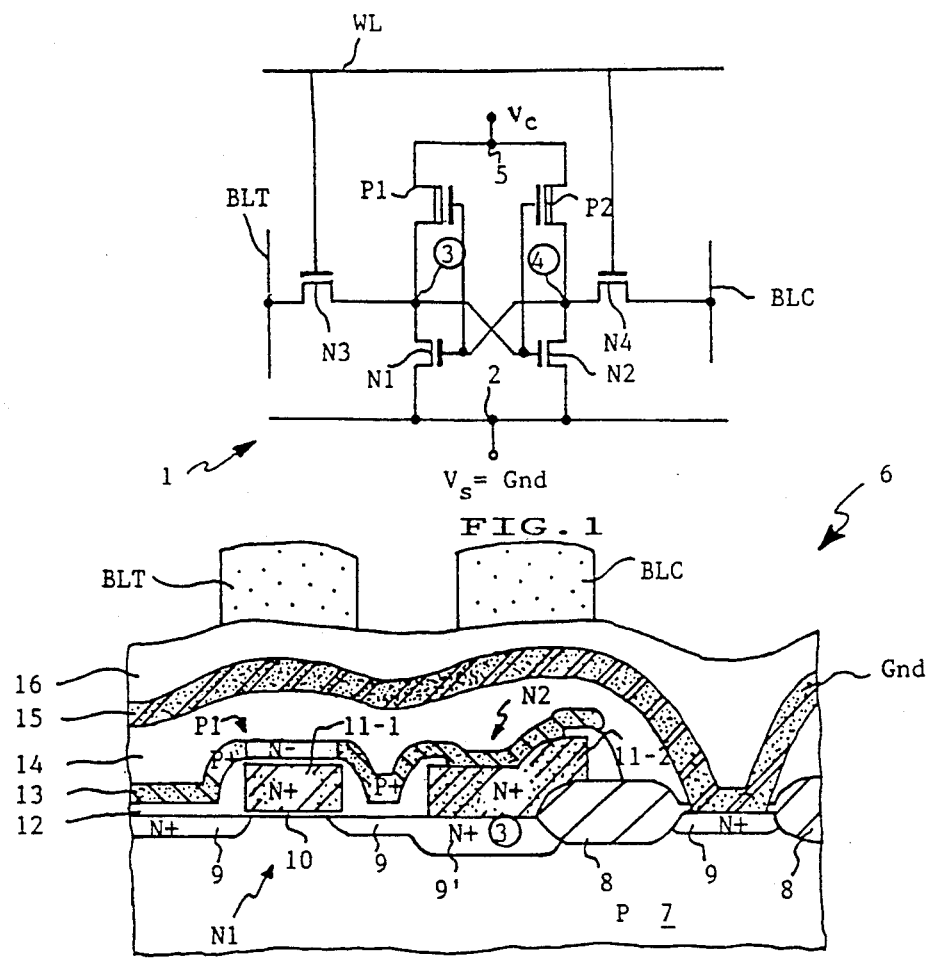
FIG. 1
FIG. 2
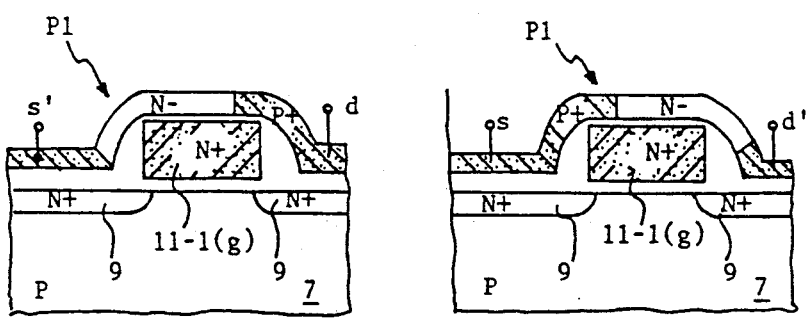
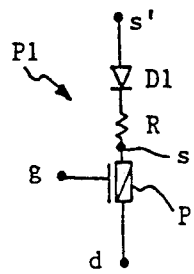
FIG. 3A
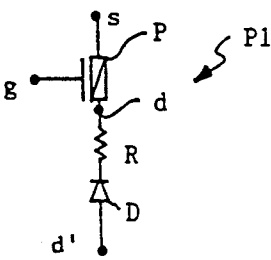
FIG. 3B

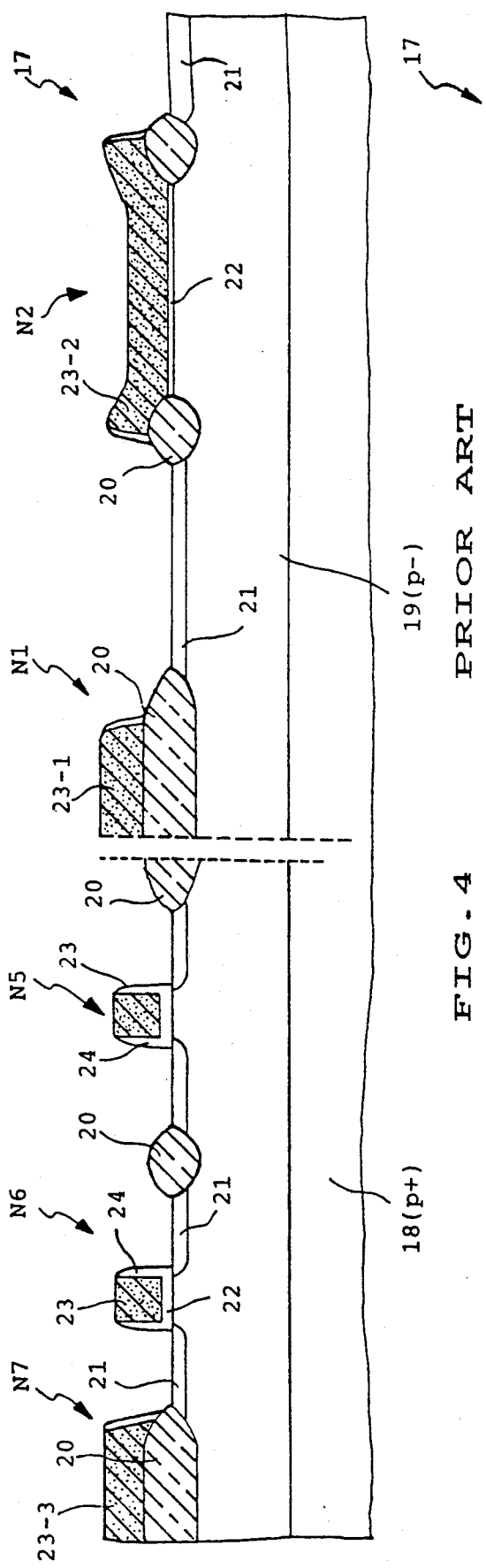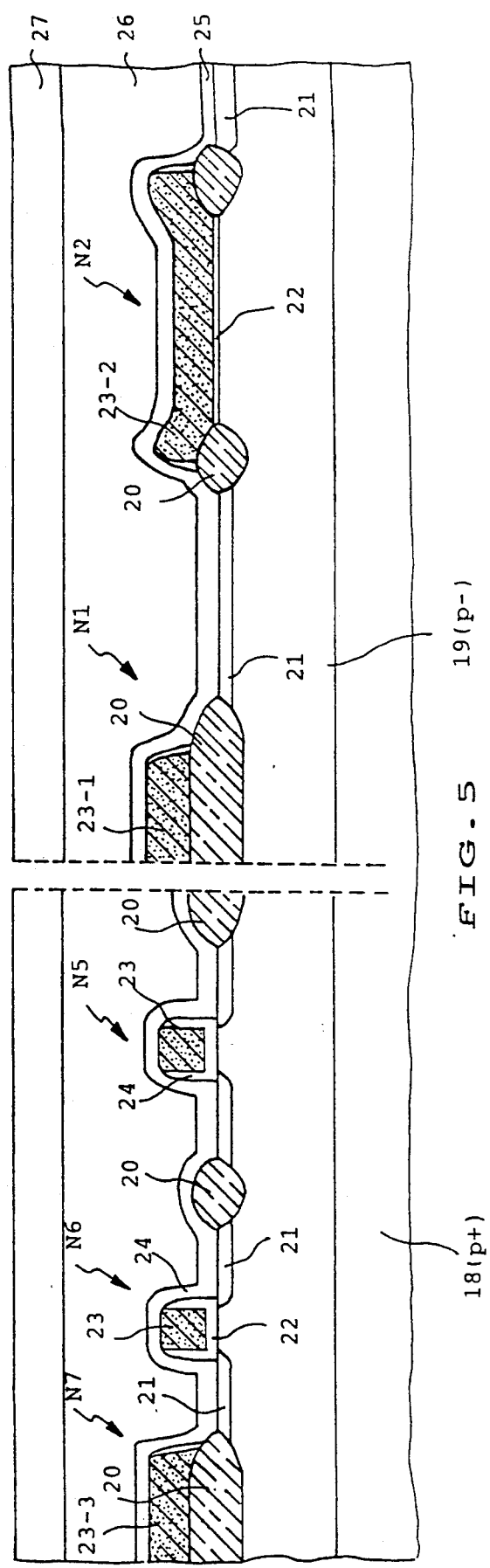

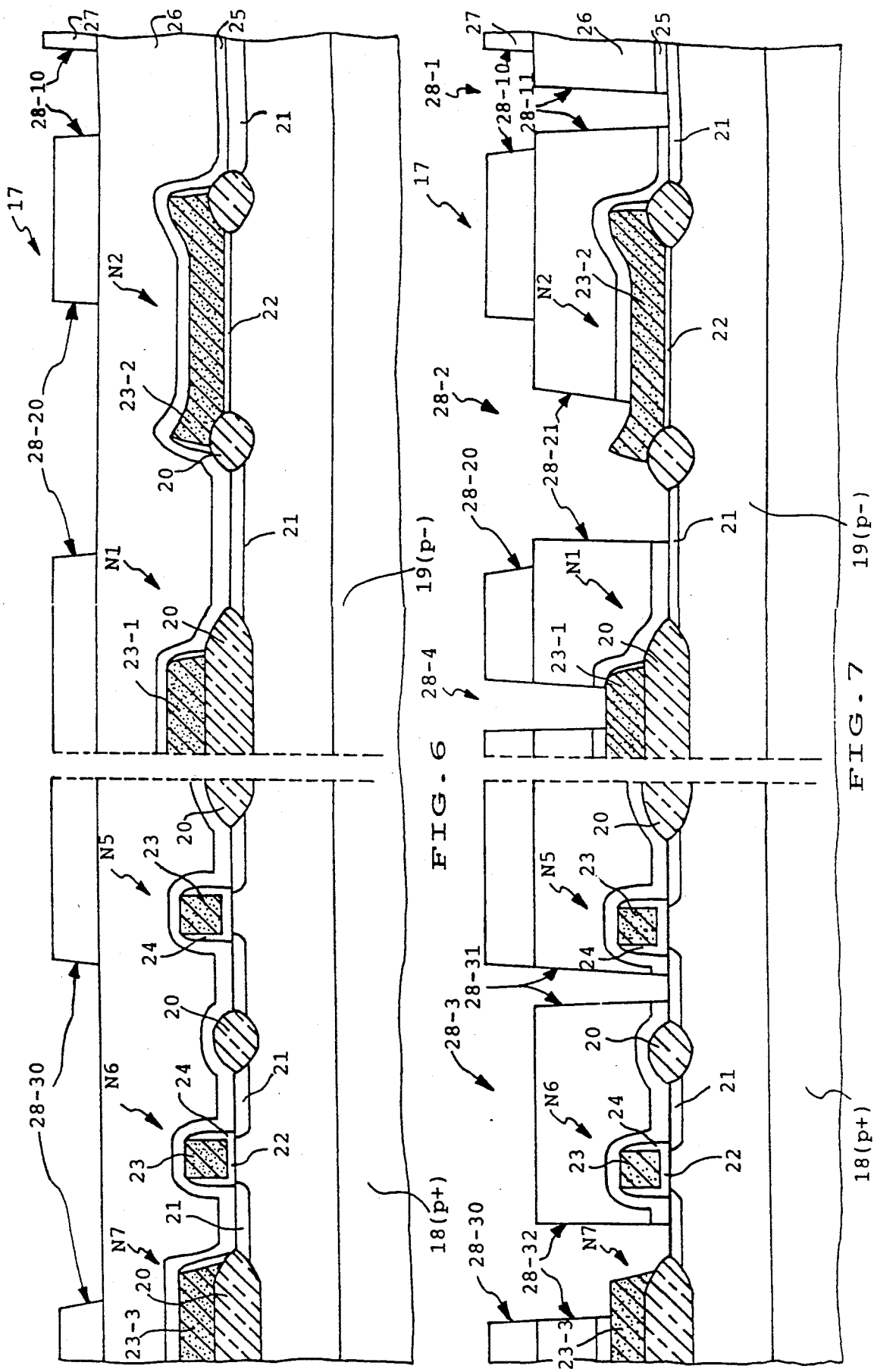

METHOD OF FORMING STACKED TUNGSTEN GATE PFET DEVICES AND STRUCTURES RESULTING THEREFROM

FIELD OF THE INVENTION

The present invention relates to Integrated Circuit manufacturing and more specifically to a method of forming stacked tungsten gate PFET devices in semiconductor chips and to structures resulting therefrom. In particular, the method has wide application in the forming of stacked tungsten gate PFETs to be used as load devices in six device (6D) SRAM cells.

BACKGROUND OF THE INVENTION

Polycrystalline silicon (polysilicon) resistors are commonly used as load devices in a variety of digital and analog applications, and in particular, in Static Random Access Memories (SRAMs). SRAM cells with resistive loads are hereafter referred to as the 4D/2R SRAM cells. Stacking polysilicon load resistors above the NFETs in 4D/2R SRAM cells can be advantageously used in the layout of an SRAM chip. This results in significant reductions in the SRAM cell size because the cell area is then only determined by the area used by the NFETs. It has become now a common practice in the industry to have the load resistors of 4D/2R SRAM cells formed by resistive polysilicon lands obtained from a very thin layer of either intrinsic or lightly doped polysilicon material. However, because these load resistors must be fairly high-valued, say in the tera-ohms $10^{12}\Omega$ range and above, in order to decrease the current drawn by the cell, capacity of 4D/2R SRAM cell chips appears to be limited to the 1 megabit range. As a matter of fact, for increased capacities, the polysilicon layer would be so thin that the process tolerances would be too difficult to control. Moreover, 4D/2R SRAM cells are also very sensitive to soft errors produced by alpha particles. Beyond the 1 megabit range, stacked PFETs (rather than polysilicon resistors) should be used as load devices, although this is achieved at the cost of a significantly more complete manufacturing process.

FIG. 1 shows a conventional 6D SRAM cell circuit referenced 1 with PFETs as load devices. Two cross-coupled NFETs N1 and N2, so-called driver transistors, are connected between common node 2 attached to a first supply voltage Vs (usually, ground Gnd) and respective nodes 3 and 4, so-called charge storage nodes. These nodes 3 and 4 are connected to a common node 5 attached to a second supply voltage (usually a positive voltage Vc), respectively, through PFETs P1 and P2. On the other hand, nodes 3 and 4 are also respectively connected to the bit lines BLT and BLC through NFETs N3 and N4, so-called access transistors. The gate electrodes of NFETs N3 and N4 are connected to the word line WL for READ and WRITE operations.

FIG. 2 is a partial cross-sectional view of the structure of the 6D SRAM cell circuit of FIG. 1. This structure is integrated in a semiconductor substrate according to a conventional CMOS manufacturing process offering stacked polysilicon gate PFET devices (sPFETs). The structure 6 provides a good example of the state of the art and is extracted from an article entitled: "A 0.1 µA stand-by current ground-bounce-immune 1-M bit CMOS SRAM by M. Ando et al, published in the IEEE JSSC, Vol. 24, N° 6, Dec. 1989, pp. 1708-1713. Reference numeral 7 indicates the P type silicon substrate, whereas 8 indicate the different field recess oxide (ROX) regions that are used to isolate the different active regions of the structure. Numerals 9 are active N+ implanted source and drain regions of the NFETs; 10 shows the gate dielectric layer, typically an $SiO_2$ layer. The highly doped N+ polysilicon gate electrodes of driver NFETs N1 and N2 are respectively referenced as 11-1 and 11-2. Polysilicon gate electrode 11-2 forms a buried contact with region 9' which is a protrusion of the drain region 9 of NFET N1. The gate electrodes 11-1 and 11-2 and the source and drain regions of NFETs N1 and N2 are covered by a thin insulating protective layer 12 of $SiO_2$ 2 which forms oxide sidewalls or spacers on the lateral sides of gate electrode 11-1 of NFET N1. A polysilicon land 13 surmounts gate electrodes 11-1 and 11-2 and is isolated from the gate electrodes by the $SiO_2$ layer 12. Polysilicon land 13 results from the patterning and selective doping of an intrinsic or lightly doped polysilicon layer that has been deposited to form the body of sPFETs. As apparent from FIG. 2, this polysilicon land 13 is highly doped with a P type dopant except in the region above gate electrode 11-1. The undoped region forms the channel region of the sPFET P1 while the adjacent P+ doped regions form the source and drain regions thereof. An extension of the drain region of sPFET P1, so-called the extended drain region, contacts the small portion of gate electrode 11-2, which is exposed through an opening in oxide layer 12. N+ doped gate electrode 11-1 of NFET N1 also plays the role of gate electrode of sPFET P1, while layer 12 is the gate dielectric thereof. More generally, for each cell, oxide layer 12 is opened in all locations where it is necessary to make a contact between the N+ doped polysilicon gate electrode of a NFET and the adjacent P+ extended drain region of the corresponding sPFET. Note that region 9 and protrusion thereof 9', gate electrode 11-2 and the extended drain region of sPFET P1 13 are at the potential of node 3, achieving thereby the desired cross-coupling of the devices, as illustrated in the cell circuit of FIG. 1. At this stage of the process, the structure is said to have completed the Master Slice processing steps of a polysilicon gate CMOS FET technology. The structure is passivated by a relatively thick, insulating $SiO_2$ layer 14, about 500 nm thick. As such, the structure results from the FEOL (Front End Of the Line) processing.

Elements that will now be described are formed during the personalization steps or BEOL (Back End Of the Line) processing. Numeral 15 is a typical example of a polycide land or line used as a power bus. In FIG. 2, polycide land 15 which connects a N+ active region 9 (the source region of a NFET not illustrated in FIG. 2) to Gnd to be called thereafter the Gnd bus. An additional insulating $SiO_2$ layer 16 completes the structure. Layer 16 is provided with contact openings (not shown) to allow appropriate contacting between metal bit lines BLT and BLC and power busses (e.g., Vc power bus). As apparent from FIG. 2, all succeeding layers, and in particular polysilicon layer 13, are conformally deposited, which results in the typical "corrugated" relief aspect of the upper layers of structure 6.

The cell construction of FIG. 2 wherein the PFETs are used as loads and stacked above the NFETs, is of great interest in terms of density, because the cell area is only determined by the area of NFETs. However, the disclosed semiconductor structure and its corresponding manufacturing process have some drawbacks that are listed below.

1. The structure of FIG. 2 needs for its fabrication six more additional masks with respect to a conventional manufacturing process of 6D SRAM cell chips not offering sPFETs in the menu. The first mask is used to remove the gate oxide layer 10 above protruded source region 9' of NFET N1 to allow the buried contact between gate electrode 11-2 and region 9'. The second mask makes an opening above gate electrode 11-2. The third mask delineates the N type lightly doped polysilicon layer 13. The third mask is used to shape the desired polysilicon land wherein sPFET P1 and its related extended drain region (for connection with underlying gate electrode 11-2) are formed. The fourth mask is a block-out mask that is required to protect the channel region of sPFET P1 from implantation of P type dopants, while forming the highly doped P+ source and drain regions thereof, along side the extended drain region. The fifth mask defines contact openings where polycide lands conveying the Gnd potential contact source regions 9 of certain NFETs, e.g., driver transistors (not referenced). An example of a Gnd bus is shown in FIG. 2. Finally, the sixth mask delineates said polycide lands, comprised of word lines and some power busses.

2. sPFET P1 depends on the underlying NFET N1 size and layout, which in turn results in less flexibility in the design. Because the gate electrode 11-1 of NFET N1 is also the gate electrode of sPFET P1, the layout of the two devices are strongly coupled both in terms of device size and device layout. More generally, since the gate length of the NFET, e.g. N1, must be at the minimum allowed by the lithography for maximum performance, so must be the gate length of the corresponding sPFET, e.g., P1. This constitutes a potential source of reliability hazards. Firstly, if the out-diffusion of the P+ dopants contained in the implanted source and drain regions of the sPFET P1 is not well controlled, the source and drain regions become too large, thereby reducing the effective channel length of sPFET P1. As a consequence, punch-through problems can occur. The channel length of sPFET P1 cannot be increased since this length is dictated by the performance requirements of NFET N1 as mentioned above. In addition, since the block-out mask defining the channel region of sPFET P1 is also at minimum image size, alignment tolerance between this block-out mask and the channel region can result in a channel region not correctly aligned with the gate electrode. FIGS. 3A and 3B illustrates the effect of misalignment on sPFET P1 as to the introduction of parasitic devices to an ideal PFET P (that would be obtained, should misregistration not exist) that has inherently a poor performance. In the first case (positive misalignment) shown in FIG. 3A, diode D (forwardly-biased) and a high value resistor R are in series with the source region s of the ideal PFET P. These parasitic devices decrease the effective gate to source overdrive voltage (VGS-VT) of sPFET P1 (which already has a high threshold voltage VT), and hence will decrease the "ON" current of sPFET P1. In the second case (negative misalignment), shown in FIG. 3B, the parasitic devices: e.g. resistor R and diode D (now reversely-biased) are in series with the drain region d of the ideal PFET P, and similarly decrease the current capability of sPFET P1. As a result, the latter is far from an ideal PFET P.

3. The gate electrode of the sPFET P1 does not have an optimized work function. Since both NFET N1 and the corresponding sPFET P1 formed thereupon share the same N+ gate electrode 11-1, the gate electrode of the sPFET is therefore of the N+ type, while P+ type would have been preferred. It is well recognized that this situation creates some punch-through problems because the channel region is buried instead of being at the surface. Punch-through effects induce leakage currents which are critical to cell stand-by power consumption of the SRAM cell.

4. As previously mentioned in reference to FIG. 2, the conventional manufacturing process results in a non planarized structure 6. The gate oxide layer 12 and the polysilicon layer 13 forming sPFET P1 are deposited over the castellated topology of the NFET N1 gate electrode 11-1 although slightly smoothed by protective layer 12, thereby creating reliability problems, known as "step coverage" (since polysilicon layer 13 is much thinner than gate electrode 11-1).

5. A parasitic P+/N+ diode is formed between N+ gate electrode 11-2 of NFET N2 and the P+ extended drain region of sPFET P1. This diode deteriorates the contact quality which is no longer of the ohmic type, thereby slowing down the SRAM cell performance.

6. The word lines WL, some power busses and possibly the local interconnect scheme that makes straps and short distance connections at the silicon wafer level, are made of polycide. Polycide is a good conductive material; however it is known to exhibit higher resistivities than metal.

7. Finally, the structure of FIG. 2 has poor design flexibility because of the difficult contacting of source region of sPFET P1 to Vc power bus in the presence of polycide lands 15.

OBJECTS OF THE INVENTION

It is therefore a primary object of the present invention to provide a method of forming stacked tungsten gate PFET devices using reduced masking steps.

It is another object of the present invention to provide a method of forming stacked tungsten gate PFET devices that is independent of NFET device size and layout, thereby avoiding leakage and misregistration problems.

It is another object of the present invention to provide a method of forming stacked tungsten gate PFET devices, wherein the gate electrodes of the devices are made of P+ polysilicon to improve operation.

It is another object of the present invention to provide a method of forming stacked tungsten gate PFET devices wherein said devices are formed on planar surfaces to achieve better reliability.

It is another object of the present invention to provide a method of forming stacked tungsten gate PFET devices, wherein no parasitic diodes are produced in the contacts, thus achieving a better performance.

It is another a further object of the present invention to provide a method of forming stacked tungsten gate PFET devices wherein word lines, power busses and local interconnect straps are formed of metal, providing improved conductivity.

It is still a further object of the present invention to provide a method of forming stacked tungsten gate PFET devices offering good design flexibility for easy contacting of the source regions of PFET devices to the Vc power bus.

SUMMARY OF THE INVENTION

In accordance with the present invention, there is provided a new and improved stacked semiconductor structure including a base structure comprised of a semiconductor substrate having active regions of devices formed therein and a plurality of polysilicon lines formed thereupon after completion of the Master Slice processing steps, the stacked semiconductor structure comprising:

a first thick passivating layer formed onto said base structure having a set of first metal contact studs therein contacting at least one of said active regions and/or said polysilicon lines, the upper part of said first contact studs defining either gate electrodes of PFET devices and/or interconnection conductors; the surface of said first metal contact studs being coplanar with the surface of said first thick passivating layer;

a thin insulating layer disposed over said first thick passivating layer forming the gate dielectric layer of PFET devices and provided with contact openings to expose desired portions of said first contact studs at desired locations;

a plurality of polysilicon lands formed over said thin insulating layer, certain portion thereof defines the source, drain and channel region of the body of a PFET device; at least one of said source and drain regions contacting a first metal contact stud through a contact opening;

a second thick passivating layer disposed onto the resulting structure having a set of second metal contact studs therein contacting at least one of said polysilicon lands and/or said first contact studs, the surface of said second metal contact studs being coplanar with the surface of said second passivating layer.

In accordance with another aspect of the present invention, there is provided a new and improved manufacturing method for producing a stacked semiconductor structure, including the steps of:

a) depositing a first thick passivating layer of a dielectric material that can be planarized onto the base structure;

b) forming a set of first stud openings in the first thick passivating layer exposing at least one active region and/or one of the polysilicon lines;

c) depositing a first layer of a conductive material to fill the first stud openings and define a set of first contact studs, the upper part of some of the first contact studs comprising the gate electrodes of PFET devices;

d) planarizing the structure to make the top surface of the first contact studs coplanar with the surface of the first thick passivating layer;

e) depositing a thin insulating layer to form the gate dielectric of PFET devices and patterning it to define contact openings to expose selected first contact studs at desired locations;

f) depositing a layer of polysilicon lightly doped with an impurity of a first type of conductivity;

g) patterning the polysilicon layer to define a plurality of polysilicon lands contacting the first contact studs at the desired locations;

h) selectively implanting ions of a second type of conductivity dopant in the structure to define the source and drain regions of the PFET devices and interconnection conductors in certain polysilicon lands or portions thereof;

i) depositing a cap layer;

j) depositing a second thick passivating layer of a dielectric material that can be planarized;

k) forming a set of second stud openings in the second thick passivating layer to expose desired portions of the polysilicon lands and/or portions of the first contact studs;

l) depositing a second layer of conductive material to define a second set of second contact studs;

m) planarizing the structure to make the top surface of the second contact studs coplanar with the surface of the second thick passivating layer.

Preferably, said conductive material is a metal, typically tungsten and the ions of a second conductivity type are boron ions.

Compared to the background art approach with reference to the structure of FIG. 2, the present inventive method of forming stacked tungsten gate PFET devices sPFET and structures resulting therefrom has definite advantages, including: 1. Only four extra masks are required, 2. The sPFET is independent of the underlying NFET size and layout. 3. the sPFET is controlled by a tungsten gate electrode. 4. the sPFET device is formed on a planarized surface. 5. the N+/P+ diode contact structure is replaced by a tungsten contact stud forming an ohmic contact. 6. Word lines WL, Gnd and Vc power busses, and the local interconnect conductors are made of metal instead of polycide. 7. High design flexibility which allows easy contacting of the sPFET source regions to the Vc power bus.

BRIEF DESCRIPTION OF THE DRAWINGS

The present invention, as well as other objects and advantages thereof, may best be understood by reference to the following detailed description of an illustrated preferred embodiment to be read in conjunction with the accompanying drawings, in which:

FIG. 1 is a diagram showing a conventional 6D SRAM cell circuit including two PFETs as load devices as described above.

FIG. 2 is a cross-sectional view partially broken away of the structure of the 6D SRAM cell circuit of FIG. 1, when integrated in a silicon substrate, in accordance with a conventional CMOS FET manufacturing process offering stacked polysilicon gate PFET devices, as described above.

FIGS. 3A and 3B detail the PFET device structure of FIG. 2, depending on positive or negative mask misregistration, illustrating the parasitic devices introduced therein.

FIG. 4 shows a partial cross-sectional view of a conventional base structure of the 6D SRAM cell of FIG. 1 after having completed the Master Slice processing steps of a standard CMOS FET manufacturing process.

FIGS. 5 to 12 show the structure of FIG. 4 being processed through a sequence of processing steps in accordance with a preferred embodiment of the method of the present invention.

DETAILED DESCRIPTION OF THE PREFERRED EMBODIMENT

Figures 8, 9:
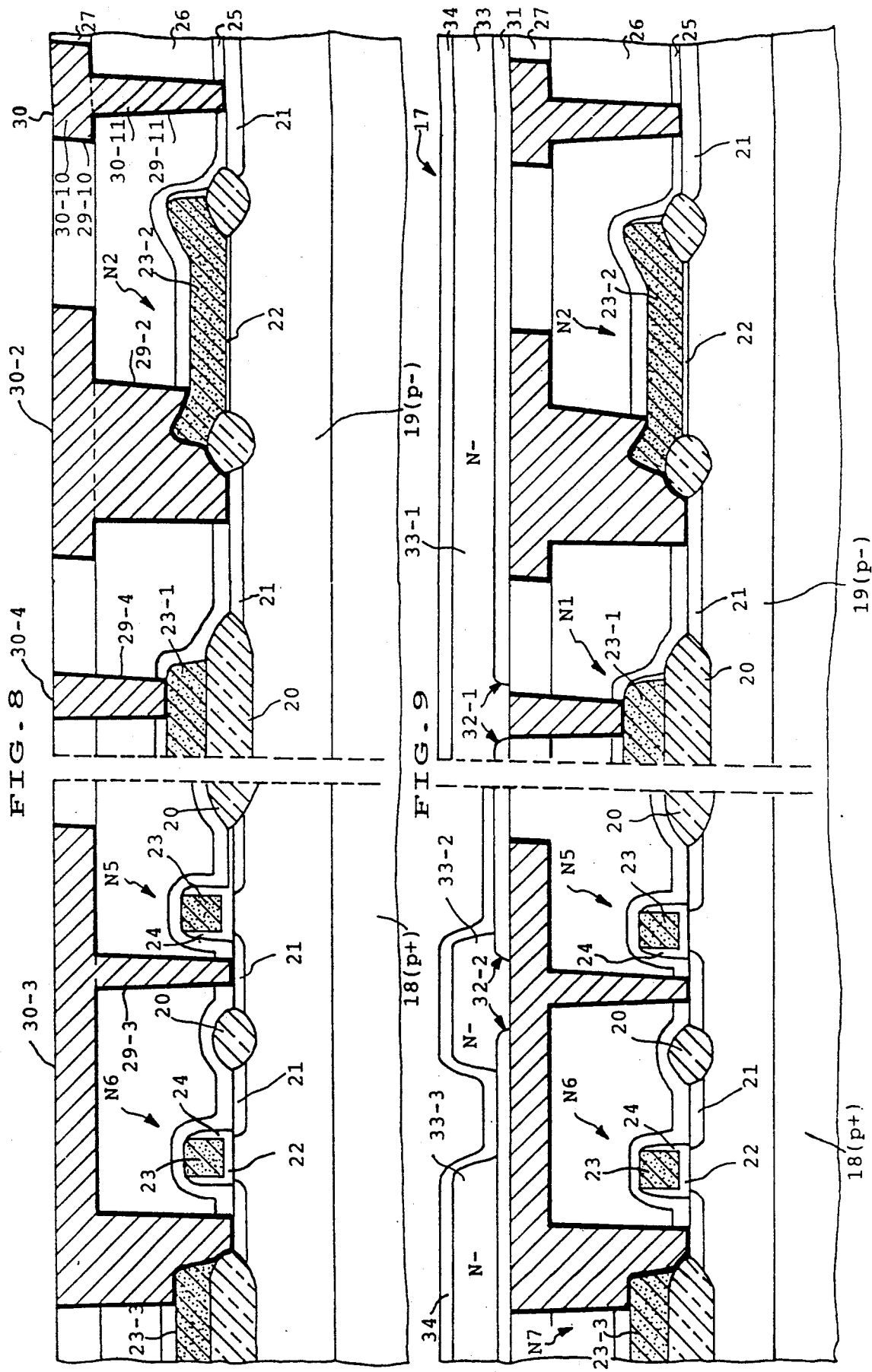

FIG. 4 shows a partial cross sectional view of a conventional base structure of the prior art after source/drain region and polysilicon gate electrode formation that results from a standard polysilicon gate CMOS FET process. On the right hand side is shown a driver NFETs N1 and N2 combination of the 6D SRAM cell circuit of FIG. 1 similar to the structure shown in FIG. 2. On the left hand side is shown three adjacent NFETs referenced as N5, N6 and N7, that can be found in the I/O circuit portion of the chip outside the memory array. In FIG. 4, the whole structure is designated by reference 17 and is briefly described below.

The starting material consists of a conventional P+ silicon substrate 18 having a P− epitaxial layer 19 thereon. ROX regions 20 are used in a manner well known to those skilled in the art, to isolate active regions one from another at the surface of the wafer. N+ implanted active regions 21 formed in the epitaxial layer 19 constitute the source and drain regions of the NFETs. Active regions 21 are generally provided with a thin $TiSi_2$ contact layer (not shown) to reduce sheet resistance thus improving electrical contact with the contact studs subsequently formed. The gate dielectric layer, typically an $SiO_2$ layer, is referenced 22. Numerals 23 indicates the remaining portions of the N+ highly doped polysilicon layer that has been patterned to create the polysilicon gate electrodes. Numerals 23-1 and 23-2 designate respectively the gate electrodes of NFETs N1 and N2. Oxide sidewalls or spacers 24 have been formed on the lateral sides of the polysilicon gate electrodes for a better definition of the channel length of the NFETs. The above-described device structure of FIG. 4 is shown for the purpose of illustrating the present invention, and is a conventional structure in the art, advantageously used in the fabrication of many known semiconductor CMOS FET structures, but not necessarily limited to CMOS technology. Firstly, the remaining polysilicon portions are not limited to gate electrodes, they could alternatively be lands used as conductors, e.g., forming the extrinsic base contact in a polysilicon self-aligned bipolar transistor manufacturing process. Consequently, the remaining polysilicon portions 23 will be referred henceforth to polysilicon lines. Secondly, active regions 21 are not limited to source and drain regions of FETs but also include the emitter, base and collector of bipolar devices. Taking into account that the structure of FIG. 4 could be adapted to a bipolar, CMOS or BiCMOS manufacturing process, any base structure at the stage of FIG. 4, is said to have completed the Master Slice processing steps. Active regions 21 (irrespective the type of devices formed therein), and optionally, polysilicon lines 23-1, ... have thus been formed.

Referring now to FIGS., 5, to 12, in FIG. 5 a relatively thick multilayer structure of passivation and planarization dielectric material is deposited onto the conventional base structure of FIG. 4. To this end, the wafer is cleaned by dipping it in a tank containing an $H_2SO_4/H_2O_2$ (4:1) acidic solution. This cleaning step will be referred henceforth as the Piranha cleaning process. A thin $Si_3N_4$ diffusion barrier layer (not shown) is blanket deposited over the wafer with a thickness of 50nm. The $Si_3N_4$ diffusion barrier layer avoids potential dissolution of the $TiSi_2$ layer in the upper layer to be subsequently formed. This step is completed in a standard LPCVD equipment, at 785°, with a SiH reactive gas. An intrinsic polysilicon etch stop layer 25 conformally deposited over the surface of the wafer using conventional CVD process to a thickness in the range of 50 nm. The etch stop layer is used to protect the bird's beak of the ROX regions, should a contact stud overlying both silicon (e.g. at a source/drain region) and $SiO_2$ (e.g. at a ROX region) be required. The material forming this etch stop layer must have good etching selectivity with the phosphosilicate glass (PSG) layer to be subsequently formed. $Al_2O_3$ is suitable although intrinsic polysilicon is preferred, because it has a desirable high etch ratio with PSG, say about 25:1, and it is easier to etch. The structure is then cleaned again in two steps: first, using the Piranha cleaning process followed by a Huang B cleaning in an $H_2O/HCl/H_2O_2$ (5:1:1) acidic solution and then, finally rinsed. The PSG layer 26 is now deposited conformally at 400° C., using a $SiH_4/PH3$ gas with $N_2$ as the carrier gas in a APCVD reactor, such as a WATKINS-JOHNSON, to reach a thickness of 900 nm. Optionally, a 200 nm thick intermediate pyrolitic $SiO_2$ layer (not shown) can be inserted between intrinsic polysilicon layer 25 and PSG layer 26. Its purpose is to protect the intrinsic polysilicon layer 25 from phosphorous dopants contained in layer 26. The deposition is achieved in an AME-5000 at 440° C. in an $O_2/SiH_4/N_2$ environment. Next, the PSG layer 26 is chem-mech polished for fine planarization in a WESTECH or STRAUSBAUGH equipment using a solution of colloidal $SiO_2$ in water, e.g. the slurry referenced SC1 and sold by SPEAR CARBO. After polishing, the remaining thickness is 600 nm. This step is followed by post-cleaning in a SVG double-sided brush cleaner.

Following the previously mentioned two-step cleaning process, a deposition of PECVD $SiO_2$ oxide layer 27 takes place. The purpose of this layer is to act as a diffusion barrier that effectively blocks the outdiffusion of the phosphorous dopants contained in the PSG layer into the upper layer of polysilicon to be subsequently formed. This step is completed with standard PECVD equipment, such as an AME-5000. The desired thickness of layer 27 is in the order of 200 nm. Should a non contaminating passivating and planarizing dielectric material be used, e.g. quartz, layer 27 could be eliminated. Quartz is appropriate, but results in an expensive process. Organic materials, such as polyimide, are also appropriate but behave badly in hot processing steps. Phosphosilicate glass (PSG) is the preferred material, although it necessitates an etch stop layer and at least two diffusion barrier layers. The wafer is then annealed in a furnace at 750° C. for 1 hour in an $N_2$ ambient. The resulting structure is shown in FIG. 5. This terminates the list of elements formed during the FEOL processing steps.

Forming the set of first stud openings generically referenced 28 is now carried out. First stud openings, are generally formed in two successive etching steps, using two different masks: GS and CA. After a two-step cleaning, a photoresist adhesion promoter such as HMDS is applied onto the structure (prebake time: 7 mn), followed by standard photoresist, (e.g. the e-MERCK resin), preferably, with MTI MULTIFAB equipment, and baked. After alignment, the resist is exposed to UV light through a mask using a NIKON G6 stepper and developed to produce an in-situ GS resist mask (not shown) having the desired configuration. The first subset of openings is then formed by etching the PECVD $SiO_2$ diffusion barrier layer 27.

FIG. 6 shows the structure after patterning the LPCVD $SiO_2$ layer 27. However, during the formation of first subset of openings, the PSG layer could also be partially etched. The first subset of openings consists of openings 28-10, 28-20 and 28-30. These openings correspond, respectively, to a top contact stud, a gate electrode and an overpass conductor to be subsequently formed. The first etching step is achieved by preferably using an AME 8300 equipment, with a $CHF_3/O_2$ reactive gas supply the reactive ions. The in-situ resist mask GS is stripped and the structure is cleaned in a Piranha solution.

A second subset of openings is formed by etching the thick PSG planarized layer 26 (and the optional pyrolitic layer mentioned above, if any), downwards to the etch stop layer 25. To that end, a second in-situ photoresist mask CA (not shown) is applied to the structure in a similar manner as described above. A second subset of openings is then created. The second step of etching can be achieved with the same AME 8300 equipment, using $CHF_3/O_2$ reactive gas, since PECVD $SiO_2$ and PSG are quite similar materials. Finally, the exposed portions of the intrinsic polysilicon etch stop layer 25 are etched with the same RIE equipment using a $Cl_2/O_2/Ar$ or $HCl/O_2/Ar$ plasma. The resist is stripped off and the structure cleaned anew.

Next, the structure is annealed in an ambient of ammonia ($NH_3$) using a THERMCO equipment, at 700° C., for 55 minutes with $N_2$ as the carrier gas. The intrinsic polysilicon layer 25 is oxidized through the thick dual passivating layer 26/27 to become electrically neutral. This step is achieved by THERMCO oxidation furnace model HiPOX, at high pressure. Finally, the exposed portions of the underlying $Si_3N_4$ layer are etched in $SF_6$ plasma. As shown in FIG. 7, different configurations are possible. First stud opening 28-1 comprises both upper and lower parts referenced 28-10 and 28-11 corresponding to said first and second etching steps respectively. These two etching steps allows the decoupling of the sizes of said first and second subsets of openings. For example, the size of the lower opening (e.g. 28-21) may be at the minimum size afforded by the lithography while, independently, the upper opening (e.g. 28-20) may be larger to meet size requirements for the gate electrode formed therein. A metal contact stud will be formed in opening 28-1, when filled with metal that will contact active region 21. In a similar manner, first stud opening 28-2 is also comprised of two parts 28-20 and 28-21. When filled with metal, the upper part will form the metal gate electrode of a sPFET device, while the lower part will be a pedestal stud, interconnecting said metal gate electrode with active region 21 and polysilicon gate electrode 23-2 of NFET N2. First stud opening 28-3 consists of an upper part and two lower parts which, when filled with metal, will respectively form an overpass conductor and two pedestal contact studs connected therewith, to provide a conductive strap. The strap will interconnect an active region 21 of NFET N5, an active region of NFET N6, and a gate electrode 23-3 of NFET N7. Finally, first stud opening 28-4 is an example of an opening made in one step using the CA mask. When filled with metal, a metal contact stud will be formed to contact gate electrode 23-1.

Filling the first stud openings with a highly conductive material, typically a metal such as tungsten, and planarization are carried out. To that end, the structure of FIG. 7 is first cleaned in a 100:1 diluted HF solution and rinsed. Prior to tungsten (W) filling, a titanium (Ti) layer is deposited with a thickness of about 40 nm, preferably, using VARIAN M2000 equipment, to plate the bottom and side-walls of the first stud openings. This titanium layer prevents the diffusion of tungsten atoms in the active regions 21. Next, a thin titanium nitride (TiN) layer is formed over the titanium layer. This TiN layer improves adhesion of the tungsten layer. This step is accomplished with the same VARIAN M2000 equipment. A flow of $N_2$ is introduced in the Ar carrier gas until a thickness of 25 nm is obtained. A tungsten layer is then deposited in two steps to entirely fill the first stud openings. CVD GENUS 8700 equipment is appropriate for this operation. First, deposition is carried out at a high rate of 120 nm/min., at 450° C., using a combination of $SiH_4/WF_6/H_2/He$ gas until a thickness of 240 nm is attained. Then, the deposition continues at a lower rate of 40 nm/min. with the same equipment and with the same operating conditions, except that, $SiH_4$ is no longer used to reach the desired final thickness of about 550 nm. The deposited metal layers are now planarized using either the chem-mech technique, described in EP-A- 0223920 entitled: "Chem-mech Polishing Method for Producing Co-planar Metal/Insulator Films on a Substrate", of common assignee, or plasma etching in an AME 8100, using a $BCl_3/Cl_22/N_2$ gas. This step is followed by a post-clean operation with a SVG double-sided brush cleaner. With reference to FIG. 8 planarization of the Ti-TiN and W composite layer produces first contact pads 29 and first contact studs 30 at the first stud openings 28. Upper and lower parts thereof can be distinguished, as in FIG. 7. For example, first contact stud 30-1 is comprised of upper and lower parts, respectively, referenced as 30-10 and 30-11. A similar reasoning applies to contact pad 29-1 and is further generalized to all other first contact studs. Finally, as apparent from FIG. 8, the top surface of the first contact studs 30-x is now coplanar with the surface of the PECVD oxide layer 27.

With reference to FIG. 9, the gate dielectric of the PFET devices is formed next. To that end, a first oxide layer 31 is deposited with a thickness of about 25 nm, preferably using PECVD equipment, such as an AME-5000. After cleaning in a Piranha solution, a new in-situ resist mask (OG mask) is formed over the structure and the oxide layer 31 is opened at the desired locations. Contact openings 32 are formed in the oxide layer 31 by RIE in a AME 8300 reactor and in a $CHF_3/O_2$ environment. The structure is again cleaned. Contact openings 32, e.g. 32-1, are formed on the portions of the first contact studs where either a region of a sPFET device or an interconnect conductor (to be subsequently formed), have to contact a first contact stud.

A polysilicon layer is deposited next, to provide the desired source, drain and channel regions of the PFET devices as well as the interconnection conductors, after patterning and proper doping. To that end, a CVD intrinsic (non doped) polysilicon layer 33 is deposited with LPCVD equipment, such as ASM or TEMPRESS at 615° C., using $SiH_4$ to reach a thickness in the 10–100 nm range. However, because the sPFET device characteristics depend strongly on the grain size of polysilicon material of layer 33, it is recommended first to convert the polysilicon of layer 33 in an amorphous silicon layer and then recrystallize it at low temperature, in order to obtain as large grains as possible. Amorphization can be achieved by ion implantation of Si atoms in an EXTRION CF5 implanter at an energy, in the 25–50 KeV range and a dose of 1E15 at/cm$^2$. The recrystallization anneal is completed with a THERMCO furnace at 625°, in a $N_2$ ambient for 30 hours. Alternatively, an amorphous layer of the same thickness could have been directly formed as taught in the literature. In this case, polysilicon is deposited in a PECVD equipment or in the UHV chamber of an E-beam source evaporator and the recrystallization anneal completed in a THERMCO furnace and $N_2$ atmosphere, preferably at 600° C. for 12 hours.

A N-type dopant is now blanket implanted in the polysilicon layer 33 to adjust the threshold voltage of the sPFET devices. The concentration in N-type dopants needs to be accurately controlled in the channel region of sPFET devices. To that end, phosphorous atoms are implanted in polysilicon layer 33 to attain a concentration of $1E17$ at/cm$^3$ in the channel region of sPFETs. This step can be achieved in a EXTRION CF5 implanter and is followed by a standard implant anneal.

A photo-lithographic step (PR mask) is performed, next, similar to the one previously mentioned above, to define the appropriate in-situ resist mask. This resist mask will be used to create the desired polysilicon land configuration in polysilicon layer 33. The structure is submitted to RIE in a TEGAL 1500 using a standard reactive gas composition such as $CF_4/O_2/Cl_2/HCl$ that has a high polysilicon/—CVD $SiO_2$ etch rate ratio. The resist mask is then stripped with an adequate stripper. As illustrated in FIG. 9, three N- polysilicon lands 33-1, 33-2 and 33-3 will ultimately remain.

Instead of performing the recrystallization anneal step mentioned above before patterning the polysilicon layer 33, this step could have been performed as a subsequent operation in order to limit a local recrystallization in the polysilicon lands. In this case, this step is followed by the above mentioned blanket implant. Alternatively, the recrystallization anneal could be replaced by rapid thermal anneal (RTA), at a temperature between 600°-700° C. for 10-120 seconds, in a $N_2$ environment.

A TEOS oxide layer 34 is now deposited over the remaining polysilicon lands using PECVD equipment, such as an AME- 5000 to achieve a desired thickness of approximately 100 nm. Layer 34 is used as a screen oxide layer for a subsequent ion implant step, as will be explained later. It also acts as a diffusion barrier layer, and it encapsulates the newly formed sPFET device, separating it from the second PSG layer also to be subsequently formed. The resulting structure is shown in FIG. 9.

Figure 10:
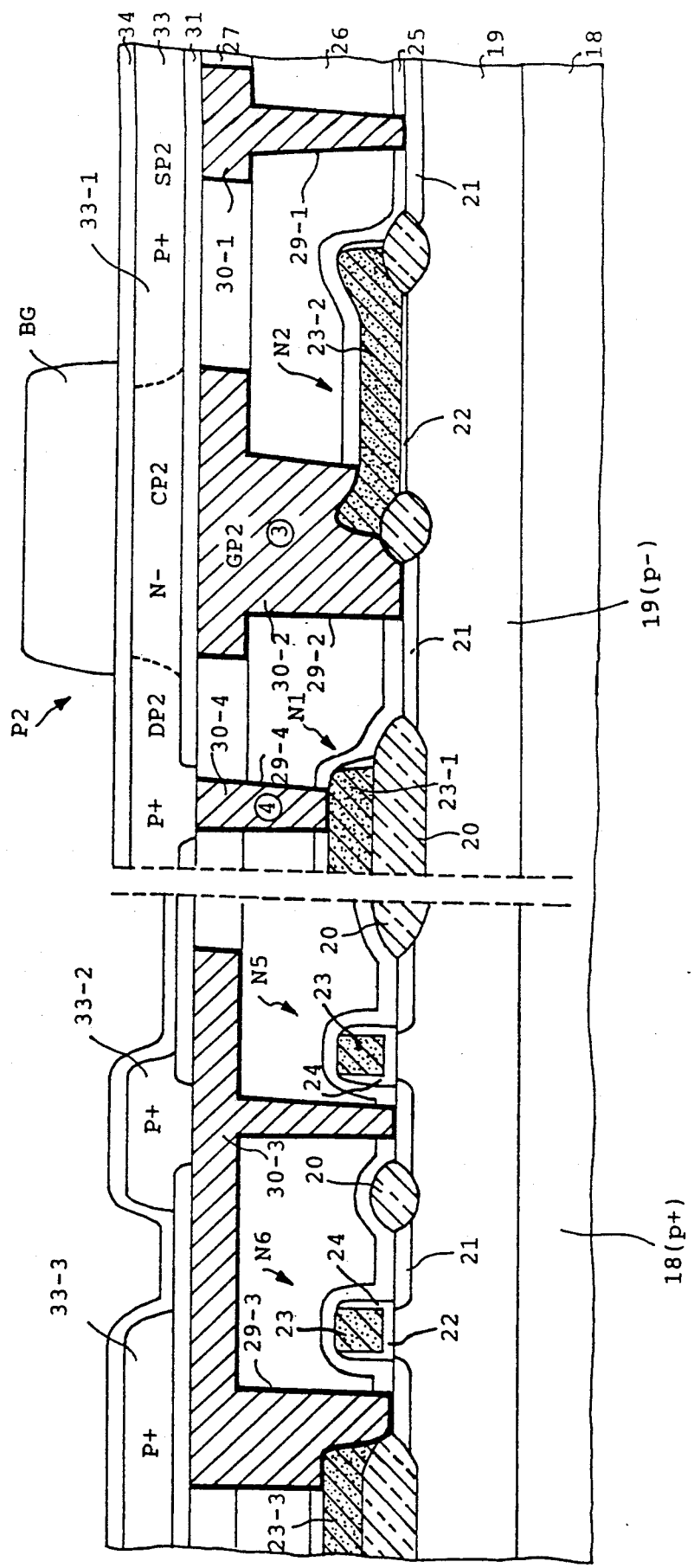

With reference to FIG. 10, a new photolithographic step (BG mask) is performed, in order to define the appropriate in-situ photoresist BG mask. This mask is used to define the source/drain regions of the sPFET devices by ion implantation. The photolithographic step is identical to the one previously described. A selective boron ion implant is then performed through screen oxide layer 34 for source/drain region definition of the sPFET devices and for doping of other polysilicon lands to define interconnection conductors. Only the channel region of sPFET devices is protected by the BG mask from ion implantation. The implantation of boron ions is performed in an EXTRION CF5 implanter at a dose of $1E16$ at/cm$^2$ and an energy of 30keV. The resulting structure is shown in FIG. 10. The photoresist in-situ BG mask is then stripped off. Finally, a low temperature (or rapid thermal) anneal is performed to reactivate the dopants in the source and drain regions of sPFETs. This step can be completed in a THERMCO furnace at a temperature ranging from 650° to 850° C, in a $N_2$ ambient and during 12 hours.

FIG. 10 shows an sPFET device P2 clearly depicted. The sPFET device P2 comprises source, drain, and channel regions respectively referenced as SP2, DP2 and CP2. The gate electrode GP2 of sPFET device P2 is separated from the body by thin gate dielectric layer 31. Gate electrode GP2 is made of metal, thereby exhibiting a better work function than N+ polysilicon as had been the case with the structure of FIG. 2. Particular attention should be drawn to the fact that contacts with the source and/or drain region of sPFET P2 could be made directly to active regions 21 and/or gate electrodes 23-x of devices by means of first contact studs. For example, drain region DP2 is shorted to gate electrode 23-1 of NFET N1 by first contact stud 30-4, these elements are therefore at the potential of node 4 (see FIG. 1). Likewise, as apparent from FIG. 10, first contact stud 30-2 not only forms gate electrode GP2 of sPFET P2 but it also interconnects gate electrode 23-1 of NFET N2, and source region 21 of NFET N1. As a result, first contact stud 30-2 is at the potential of node 3 (see FIG. 1). Should a specific source or drain region located above a first contact stud be required, a direct contact could be made without additional lithography steps. On the other hand, in the left part of FIG. 10, first contact stud 30-3 shorts polysilicon land 33-2, active region 21 of NFETs N5 and N6, and gate electrode 23-3. Polysilicon land 33-3 is isolated once it is encapsulated by oxide layers 31 and 34.

Figure 11:
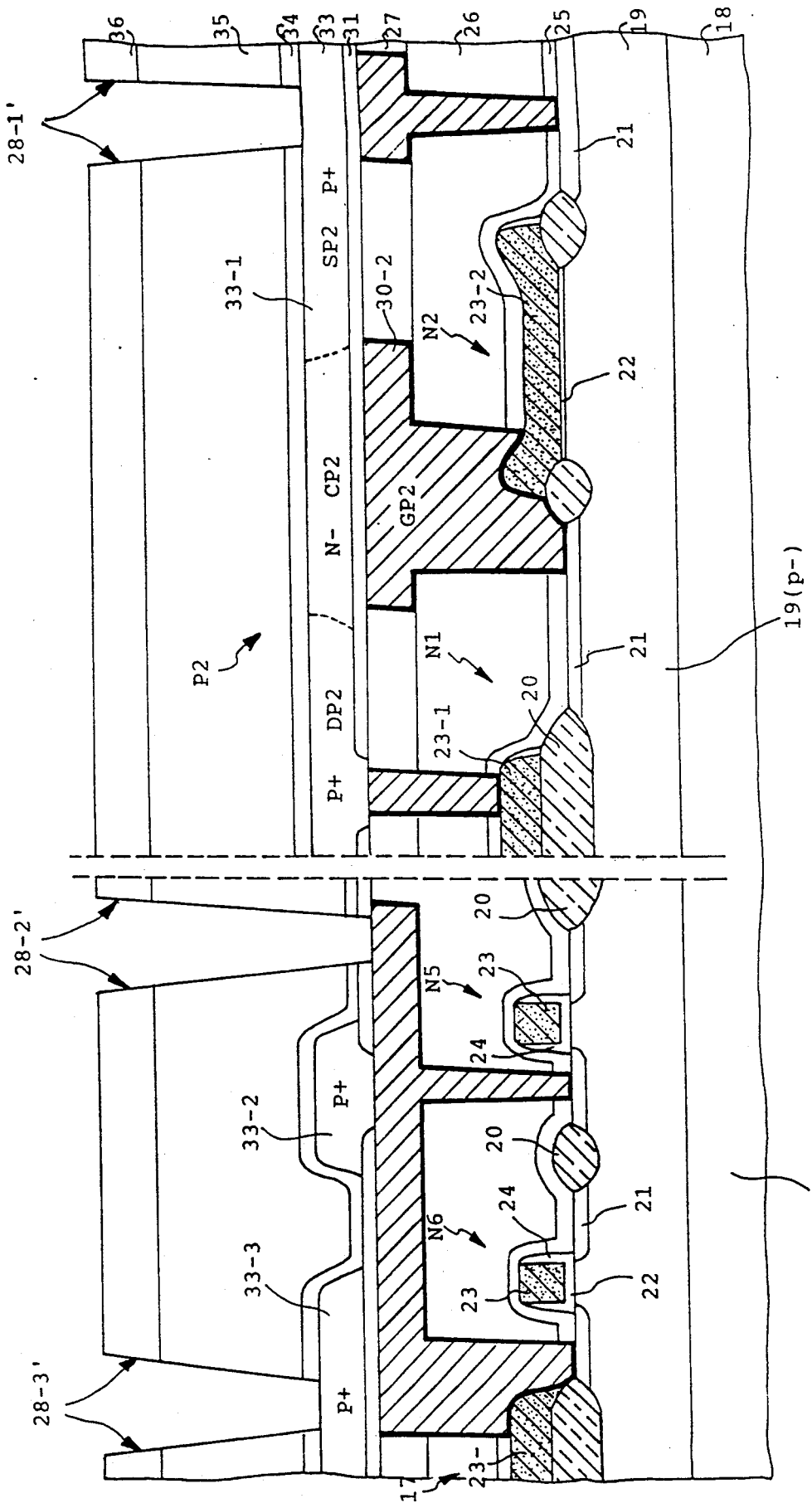

With reference to FIG. 11, a second thick PSG layer 35 is then deposited after Piranha/Huang B cleaning step. Layer 35 is submitted to a fine chem-mech planarization. This is followed by an additional thin PECVD oxide or preferably PSG layer 36 to be deposited thereon, so as to eliminate pin holes. The steps of depositing and planarizing are completed in the same manner as described above leaving the top surface of structure 17 substantially flat. After a new Piranha/Huang B cleaning step, the structure is ready for stud opening. Second stud openings 28' corresponding to the second contact studs are then opened, the etch stop layer being either the polysilicon layer 33 for the sPFET devices or tungsten for the first contact studs. The resulting structure provided with three second stud openings 28-1', 28-2' and 28-3' is shown in FIG. 11.

Figure 12:
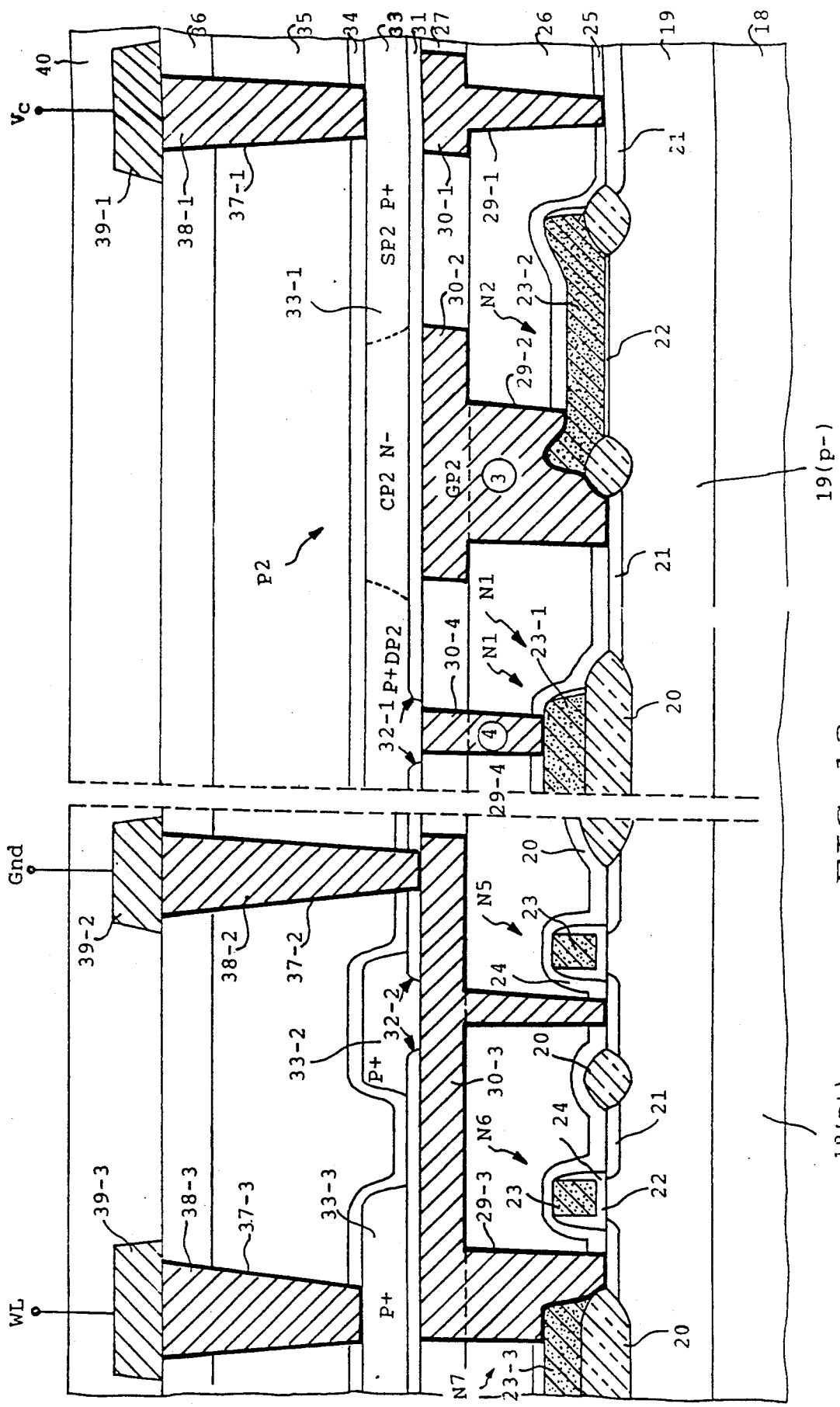

Referring to FIG. 12, the second stud openings 28-x are filled by a successive deposition of a Ti layer and Ti-N layer that are blanket sputtered on the whole wafer to form a composite Ti-TiN layer 37. Second stud openings are then filled with a tungsten layer 38. The deposited metal layers are planarized using the technique described above. Planarization of the Ti-TiN and W composite layer produces second contact pads 37 and second contact studs 38 in second stud openings 28'. Three second contact studs referenced as 38-1, 38-2 and 38-3 are shown in FIG. 12. They respectively contact the source region SP2 of sPFET P2, first contact stud 30-3 and polysilicon land 33-3. A standard first metallization layer 39 is now deposited and patterned to leave metal lands 39-1, 39-2 and 39-3 at the M1 mask level. The metallization layer may be a Ti/Al-Cu/Si metallurgy. Metal land 39-3 is the word line WL, while metal lands 39-1 and 39-2 are power busses which are respectively connected to Vc and Gnd. Normal BEOL process can now proceed. The structure is covered by an insulating film of PECVD oxide 40. The final structure is shown in FIG. 12.

In order to increase the channel mobility and decrease the threshold voltage $V_T$, hydrogen passivation of the dangling bonds can be done. It helps minimize the effects of the grain boundary potential barriers on device performance. This step, known in the art as the forming gas anneal, is completed in a furnace at 400° C. during 30 mn in an $N_2/H_2$ environment. This step may be performed at different times during the BEOL processing and at any subsequent level to improve the structure quality.

The steps of depositing the dual PSG layer 35/36, of forming second contact studs 38-x, . . . and metal lands 39-x, . . . could be repeated should the chip be of a multilevel type. Note that a planarization step is to be associated with each stud level. The structure fabrication is terminated by completing the terminal metallurgy steps including forming the contact pads of the Ball Limiting Metallurgy (BLM) and contact terminals (e.g. solder balls) in a manner well known to one skilled in the art. From the previously described process, it can be seen that, with the addition of only four masks when compared to a conventional CMOS FET process, there is provided a tungsten gate sPFET device that has a high contact flexibility through the two sets of first and second contact studs. This means that the sPFET device can be connected to the active regions of devices (e.g. N1, N2, . . . ) through first contact studs while the connection to the M1 metal lands is made by the second contact studs. A planarization step is associated to each contact stud level and the proposed sPFET device is inserted therebetween. Polysilicon lands, are used to define the body of sPFETs, but they can also be used, if necessary, as interconnection lines or conductors. For better conduction, silicidation of said lines could be required, but at the cost of an extra mask. In addition, the upper parts of the first contact studs that are used as gate electrodes of sPFETs can also be used as interconnection conductors. As an example, the upper part of first contact stud 30-3 is used as an overpass conductor when combined with two lower parts to form a strap connecting two active regions and/or polysilicon gate electrodes at the silicon wafer level.

The expected sPFET device characteristics are:

| | |
|---|---|
| Threshold voltage | 1.6–2.0 V |
| Oxide thickness | 20–30 nm |
| Channel mobility | 10 cm2/V · s |
| Subthreshold current | 2 pA |
| ON/OFF current ratio | 10E6 |

Figure 14:
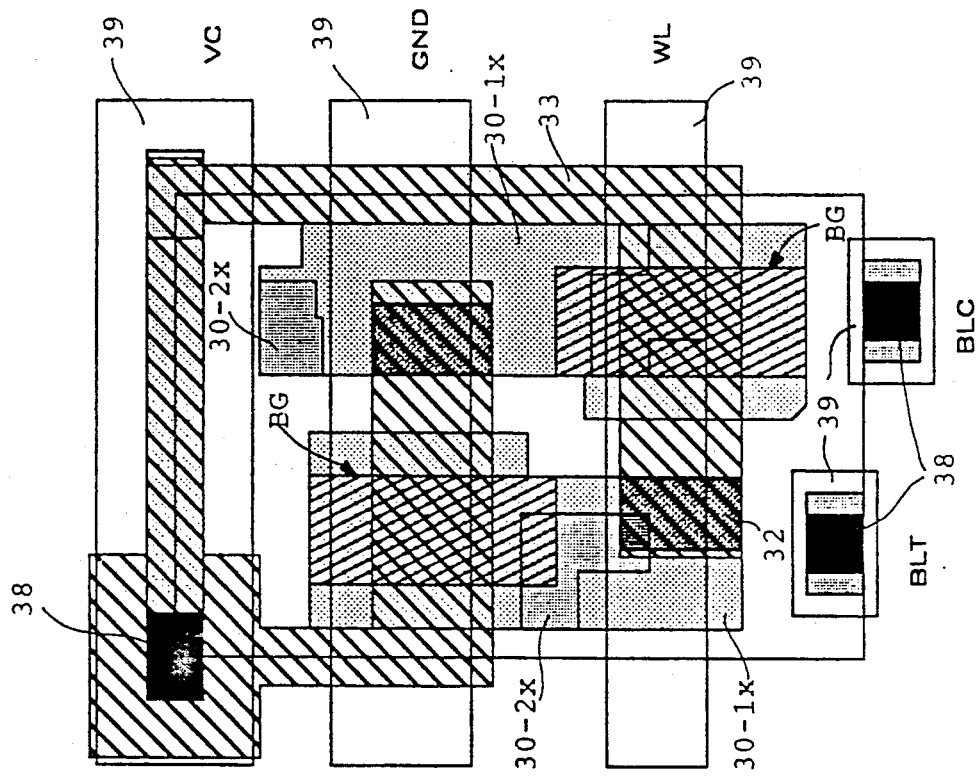
FIGS. 13 and 14 are plan views which show the layout of the 6D SRAM cell with stacked tungsten gate PFETs as load devices of the present invention at two different stages of the manufacturing.
Figure 13:
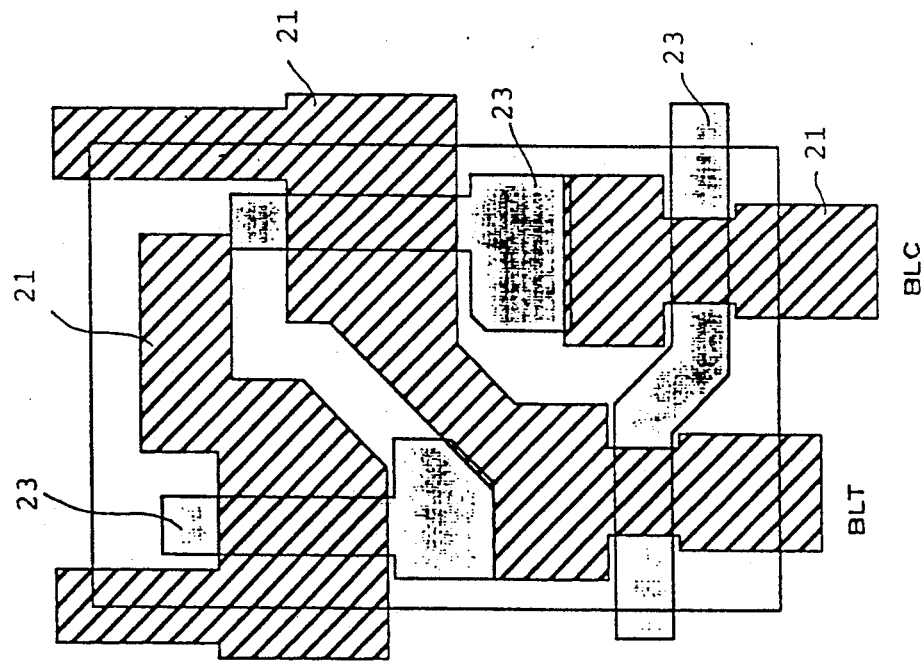

FIGS. 13 and 14 are views of a typical layout of a 6D SRAM cell when manufactured according to the method of the present invention at different stages of the manufacturing.

FIG. 13 shows the layout at the same stage as that of FIG. 5.

FIG. 14 shows the layout corresponding to the structure at the stage of FIG. 12 when the metal lands defining the power busses (Vc, Gnd) and the word line (WL) have been defined.

What is claimed is:

1. A method of forming stacked tungsten gate PFET devices on a semiconductor IC base structure having active regions of plural devices and a plurality of polysilicon lines formed therein, comprising the steps of:
    a) depositing a first thick passivating layer of dielectric material that can be planarized onto the base structure;
    b) forming a set of first stud openings in said first thick passivating layer exposing at least one active region and one of said polysilicon lines;
    c) depositing a first layer of conductive material to fill said set of first stud openings and define a set of first contact studs, such that the upper part of at least one of said first contact studs comprising a gate electrode of said stacked tungsten gate PFET devices;
    d) planarizing the structure to make the top surface of said first contact studs coplanar with the surface of said first thick passivating layer;
    e) depositing a thin insulating layer to form the gate dielectric of said stacked tungsten gate PFET devices and patterning it to define contact openings to expose at least one of said first contact studs at desired locations;
    f) depositing a polysilicon layer lightly doped with an impurity of a first type of conductivity;
    g) patterning said polysilicon layer to define a plurality of polysilicon lands contacting said first contact studs at said desired locations;
    h) selectively implanting ions of a second type of conductivity dopant in the structure to define the source and drain regions of said stacked tungsten gate PFET devices and interconnection conductors in at least one polysilicon land or portions thereof;
    i) depositing a second thick passivating layer of dielectric material that can be planarized;
    j) forming a set of second stud openings in said second thick passivating layer to expose desired portions of said polysilicon lands and portions of said first contact studs;
    k) depositing a second layer of conductive material in said set of second stud openings to define a second set of second contact studs;
    l) planarizing the structure to make the top surface of said second contact studs coplanar with the surface of said second thick passivating layer.

2. The method of claim 1 further including the step of:
    m) depositing a cap layer over said polysilicon lands prior to step h).

3. The method of claim 1 further including the step of:
    n) depositing an etch stop layer prior to step a) of depositing said first thick passivating layer.

4. The method of claim 3 further including the step of:
    o) depositing a diffusion barrier layer onto said base structure prior to step a).

5. The method of claim 4 wherein the material forming said etch stop layer and said diffusion barrier layer is intrinsic polysilicon and $Si_3N_4$, respectively.

6. The method of claim 1 wherein step a) comprises the steps of:
    a1) depositing a thick layer of PSG;
    a2) planarizing said thick layer of PSG;
    a3) depositing a thin layer of LPCVD oxide over said layer of PSG to act as a diffusion barrier to the dopants contain therein.

7. The method of claim 1 wherein said step b) is achieved in two steps.

8. The method of claim 7 wherein said two steps consist of:
    b1) forming a first subset of openings corresponding to conductors and/or gate electrodes of said stacked tungsten gate PFET devices extending partially through said first thick passivating layer;

b2) forming a second subset of openings extending certain openings of said first subset to expose at least one of said active regions and polysilicon lines.

9. The method of claim 1 wherein step j) of selectively implanting ions is made through a in-situ photoresist mask (BG) masking the channel region of said stacked tungsten gate PFET devices.

10. The method of claim 1 wherein the polysilicon of step f) is of the P-type and the dopant of step h) is boron.

11. The method of claim 1 wherein step i) comprises the steps of:
   i1) depositing a thick layer of PSG;
   i2) planarizing said thick layer of PSG;
   i3) depositing a thin layer of a group selected from LPCVD oxide and PSG.

12. The method of claim 4 further including the steps of:
   p1) depositing a metal layer onto the structure and patterning it to form metal lands, in contact with at least one of said second contact studs; and
   p2) depositing an insulating film onto the structure.

13. The method of claim 1 wherein said steps d) and l) of planarization are completed by chem-mech techniques.

14. The method of claim 1 wherein steps c) and k) comprises the steps of:
   c1) forming a composite Ti-TiN on the bottom and side walls of said first/second stud openings; and,
   c2) filling the said openings with a tungsten layer.

* * * * *